US012769012B2

(12) United States Patent
Lee et al.

(10) Patent No.: US 12,769,012 B2
(45) Date of Patent: Oct. 20, 2026

(54) METHOD FOR TRACKING LOCATION USING CONTROL PLATFORM OF SMALL BUOY FOR SIMULATING MARINE POLLUTANTS

(71) Applicant: Korea Institute of Ocean Science & Technology, Busan (KR)

(72) Inventors: Moonjin Lee, Daejeon (KR); Yongmyung Kim, Daejeon (KR); Tae-Sung Kim, Daejeon (KR)

(73) Assignee: Korea Institute of Ocean Science & Technology, Busan (KR)

( * ) Notice: Subject to any disclaimer, the term of this patent is extended or adjusted under 35 U.S.C. 154(b) by 232 days.

(21) Appl. No.: 18/761,815

(22) Filed: Jul. 2, 2024

(65) Prior Publication Data

US 2024/0353568 A1 Oct. 24, 2024

Related U.S. Application Data

(62) Division of application No. 17/731,964, filed on Apr. 28, 2022, now Pat. No. 12,204,035.

(30) Foreign Application Priority Data

Jun. 22, 2021 (KR) ........................ 10-2021-0080664

(51) Int. Cl.
*G01S 19/13* (2010.01)
*B63B 22/00* (2006.01)
(Continued)

(52) U.S. Cl.
CPC .............. *G01S 19/13* (2013.01); *B63B 22/00* (2013.01); *B63B 79/15* (2020.01); *B63H 1/14* (2013.01);
(Continued)

(58) Field of Classification Search
CPC ..... G01S 19/13; G01R 31/3835; B63B 79/15; B63B 22/00; B63B 2203/00; B63B 2213/02; B63H 1/14
See application file for complete search history.

(56) References Cited

U.S. PATENT DOCUMENTS 7,837,525 B2 * 11/2010 Napolitano ............. B63B 22/20 441/29
2012/0063262 A1 * 3/2012 Imran ..................... B63B 22/00 367/3
2019/0351978 A1 * 11/2019 Biousse .................. B63B 22/14

FOREIGN PATENT DOCUMENTS

AU 2015289475 A1 * 2/2017 ........... G01N 33/241
KR 10-0989193 B1 10/2010

(Continued)

*Primary Examiner* — Nazra Nur Waheed
(74) *Attorney, Agent, or Firm* — Knobbe, Martens, Olson & Bear, LLP

(57) ABSTRACT

Proposed are an apparatus and a method for tracking location using a control platform of a small buoy for simulating marine pollutants, in which at least one small observation buoy floats on the ocean, and a relay buoy collects location information from the observation buoy and provides the collected location information to a weather information management server. The apparatus may include at least one observation buoy and a relay buoy, the observation buoy including a GPS receiver which receives a signal transmitted from a GPS satellite and generate location information. The apparatus may also include a communicator performing wireless transmission and reception of signals with the relay buoy, and a power source providing driving power to the GPS receiver and the communicator. The relay buoy may receive location information from the at least one observation buoy and provide the received location information to a weather information management server.

3 Claims, 3 Drawing Sheets

(51) Int. Cl.
*B63B 79/15* (2020.01)
*B63H 1/14* (2006.01)
*G01R 31/3835* (2019.01)

(52) U.S. Cl.
CPC ...... *G01R 31/3835* (2019.01); *B63B 2203/00* (2013.01); *B63B 2213/02* (2013.01)

(56) References Cited

FOREIGN PATENT DOCUMENTS

| | | | |
|---|---|---|---|
| KR | 10-1559498 | B1 | 10/2015 |
| KR | 10-2018-0034716 | A | 4/2019 |

* cited by examiner

METHOD FOR TRACKING LOCATION USING CONTROL PLATFORM OF SMALL BUOY FOR SIMULATING MARINE POLLUTANTS

CROSS REFERENCE TO RELATED APPLICATIONS

This application is a division of U.S. patent application Ser. No. 17/731,964, filed Apr. 28, 2022, which claims priority to Korean Patent Application No. 10-2021-0080664, filed Jun. 22, 2021, the entire contents of which are incorporated herein for all purposes by this reference.

BACKGROUND

Technical Field

The present disclosure relates to an apparatus and a method for tracking location using a control platform of a small buoy for simulating marine pollutants. More particularly, the present disclosure relates to an apparatus and a method for tracking location using a control platform of a small buoy for simulating marine pollutants, in which at least one small observation buoy floats on the ocean, and a relay buoy collects location information from the observation buoy and provides the received location information to a weather information management server.

Description of Related Technology

According to recent development in marine technical fields, marine operations such as research of marine ecosystem, construction of underwater bases, etc. have increased, and marine incidents such as boat grounding, oil spills, etc. have also increased due to increase in maritime trade. In particular, quick response including lifesaving, prevention of secondary accident, etc. is required when an accident occurs at ocean. In the marine operations and rescue and search, etc. due to the marine accidents, a substantial part thereof is occupied by manual operations by workers due to the distinct characteristics of the ocean, which are important. Conducting operations at ocean should accompany overcoming the ocean currents whose quality varies due to several factors. In this regard, provision of accurate information regarding the ocean currents is required for safe, prompt, and efficient operations on the ocean.

Korean Patent No. 10-0989193 (hereinafter referred to as “the related art”) discloses a system for collecting and monitoring maritime information. This system for collecting maritime information collects, analyzes and provides maritime information by means of a maritime information collector installed at a specific point on the ocean.

SUMMARY

Accordingly, the present disclosure has been made keeping in mind the above problems occurring in the related art, and an objective of the present disclosure is to provide an apparatus and a method for tracking location using a control platform of a small buoy for simulating ocean current, according to which accuracy of simulating marine pollutants can be improved, by providing, to a weather information management server, location information of an observation buoy, on which influence of actual ocean currents is reflected as much as possible.

In order to achieve the objective of the present disclosure, there is provided an apparatus for tracking location using a control platform of a small buoy for simulating marine pollutants in accordance with an exemplary embodiment thereof, the apparatus including: at least one observation buoy; and a relay buoy, wherein the observation buoy comprises: a GPS receiver which receives a signal transmitted from a GPS satellite and generates location information; a communicator which performs wireless transmission and reception of signals with the relay buoy; and a power supply which provides driving power to the GPS receiver and the communicator; and the relay buoy is configured to receive the location information from the at least one observation buoy and to provide the received location information to a weather information management server.

In the present disclosure, the observation buoy includes a rubber tube filled with oil, the communicator is configured to communicate with the relay buoy by means of any one of Bluetooth, Wi-Fi, wireless LAN, NFC (Near Field Communication), and infrared communication, and the power source may be a battery.

In the present disclosure, the relay buoy may include: a communicator configured to perform wireless transmission and reception of signals with the at least one observation buoy and the weather information management server; a buoy launcher configured to launch a reserve observation buoy stored in a relay buoy main body to the ocean; a propeller configured to generate propulsion so as to move the relay buoy on the ocean; a controller configured to sense a voltage of the power source of the at least one observation buoy and, when the sensed voltage is equal to or lower than a preset voltage, to control the buoy launcher so as to launch the reserve observation buoy stored in the relay buoy main body, and to sense a signal level of the location information of the observation buoy, and when the sensed signal level is equal to or lower than a preset level, to move the relay buoy, by controlling the propeller, to a location spaced apart from the observation buoy as much as a preset distance; and a power source configured to supply driving power to the communicator, the buoy launcher, the propeller, and the controller.

In order to achieve the objective of the present disclosure, there is provided a method for tracking location using a control platform of a small buoy for simulating marine pollutants in accordance with another exemplary embodiment thereof, the method including: sensing, by a relay buoy, a voltage of a power source of an observation buoy; determining, by the relay buoy, whether the voltage of the power source of the observation buoy is equal to or less than a preset voltage; when it is determined that the sensed voltage of the power source of the observation buoy is larger than the preset voltage in the determining whether the sensed voltage of power source of the observation buoy is equal to or less than the preset voltage, receiving, by the relay buoy, location information from the observation buoy; determining, by the relay buoy, whether a signal level of the location information is equal to or less than a preset level; and when it is determined that the signal level of the location information is larger than the preset level in the determining whether the signal level of the location information is equal to or less than the preset level, transmitting, by the relay buoy, the received location information to a weather information management server.

In the present disclosure, the method may further include launching, by the relay buoy, a stored reserve observation buoy to the ocean, when it is determined that the sensed voltage of the power source of the observation buoy is equal to or less than the preset voltage, in the determining whether the sensed voltage of power source of the observation buoy is equal to or less than the preset voltage.

In the present disclosure, the method may further include moving the relay buoy to a location spaced apart from the observation buoy as much as a preset distance, when it is determined that the signal level of the location information is equal to or less than the preset level, in the determining whether the signal level of the location information is equal to or less than the preset level.

The present disclosure is advantageous in that according to the apparatus and the method for tracking location using a control platform of a small buoy for simulating marine pollutants by exemplary embodiments thereof, at least one observation buoy is configured to receive a signal transmitted from a GPS satellite, to generate location information, and to perform wireless transmission and reception of signals with a relay buoy, and the relay buoy is configured to receive the location information from the at least one observation buoy and to provide the received location information to a weather information management server, thereby enhancing accuracy of simulating marine currents by providing, to the weather information management server, the location information of the observation buoy on which the influence of actual ocean currents is reflected as much as possible.

BRIEF DESCRIPTION OF THE DRAWINGS

The above and other objectives, features, and other advantages of the present disclosure will be more clearly understood from the following detailed description when taken in conjoint with the accompanying drawings.

DETAILED DESCRIPTION

Figure 1:
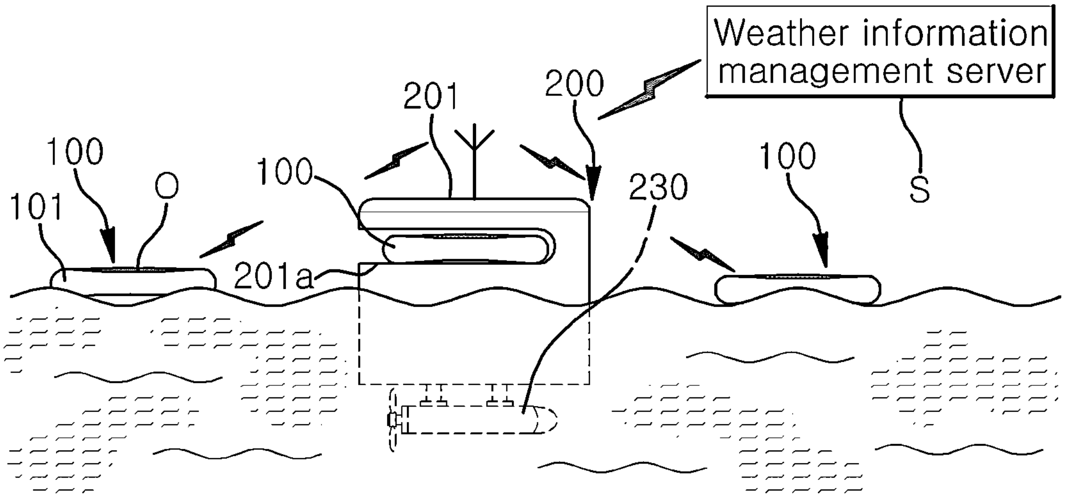
FIG. 1 is a diagram illustrating an apparatus for tracking location using a control platform of a small buoy for simulating marine pollutants in accordance with an exemplary embodiment of the present disclosure.

Maritime information provided by currently available systems is maritime information on a point on the ocean, that is, local information which cannot be deemed as information reflecting influence of actual ocean currents, and thus, this information would not be so much useful to marine operations.

In describing exemplary embodiments of the present disclosure, when it is determined that the detailed description of the known art which is related to the present disclosure may obscure the gist of the present disclosure, the detailed description will be omitted. In addition, technical terms, as will be mentioned hereinafter, are terms defined in consideration of their function in the present disclosure, which may vary according to the intention of users or operators, practice, or the like. Accordingly, the definitions of the terms will be given based on the content throughout the specification. It should not be understood that the terminology used herein is merely for the purpose of describing exemplary embodiments of the present disclosure and is not intended to be limiting the present disclosure. As used herein, the singular forms are intended to include the plural forms as well, unless the context clearly indicates otherwise. It will be further understood that the terms "comprise", "include", "have", etc. when used in this specification, specify the presence of features, integers, steps, operations, elements, components, and/or combinations of them but do not preclude the presence or addition of one or more other features, integers, steps, operations, elements, components, and/or combinations thereof.

It may be suggested that in association with each system illustrated in the drawings, elements with same or different reference numerals may be different from or similar to each other in some cases. However, elements having different embodiments may be operated with some or all of the systems seen or described in the specification. Various elements illustrated in the drawings may be identical to or different from each other, and use of the terms first, second, etc. to describe various elements is arbitrary.

In the specification, "transmission", "delivery", or "provision" by a component of data or signal to another component means that any one component directly transmits data or signal to another component, and implies that data or signal is transmitted to another component through at least one of the other elements.

Hereinafter, exemplary embodiments of the present disclosure will be described in detail with reference to the accompanying drawings.

Figure 2:
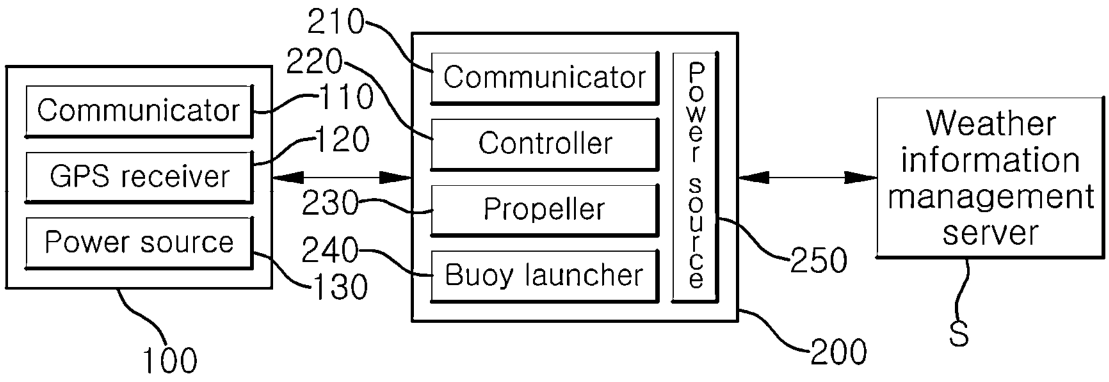
FIG. 2 is a block diagram illustrating the apparatus for tracking location using a control platform of a small buoy for simulating marine pollutants in accordance with FIG. 1.

FIG. 1 is a diagram illustrating that an apparatus for tracking location using a control platform of a small buoy for simulating marine pollutants in accordance with an exemplary embodiment of the present disclosure is disposed on the ocean, and FIG. 2 is a block diagram illustrating the apparatus for tracking location using a control platform of a small buoy for simulating marine pollutants in accordance with FIG. 1.

The apparatus for tracking location using a control platform of a small buoy for simulating marine pollutants in accordance with an exemplary embodiment of the present disclosure includes at least one observation buoy 100 and a relay buoy 200, as illustrated in FIGS. 1 and 2.

The observation buoy 100 has a main body made of a rubber tube 101 filled with oil O. Upon movement thereof, influence of ocean currents on the ocean is reflected thereon as much as possible. The observation buoy 100 includes a GPS receiver 120, a communicator 110, and a power source 130.

The GPS receiver 120 is configured to receive signals transmitted from a plurality of GPS satellites and to generate location information.

The communicator 110 communicates with the relay buoy 200 wirelessly by means of Bluetooth, Wi-Fi, Wireless LAN, NFC (Near Field Communication), and short-range wireless communication technology such as infrared communication. The communicator 110 provides location information generated by the GPS receiver 120 to the relay buoy 200 by means of the short-range wireless communication technology as described above. The communicator 110 is comprised of a short-range wireless communication module, thus being lightweight.

The power source 130 is configured to provide driving power to the GPS receiver 120 and the communicator 110 and is comprised of a battery, thus being lightweight.

The observation buoy 100 includes lightweight components as described above and thus can show movement for which influence of the ocean currents on the ocean is reflected as much as possible.

The relay buoy 200 floats on the ocean and is configured to receive location information from at least one observation buoy 100 and to provide the received location information to a weather information management server S. Compared with the observation buoy 100, the relay buoy 200 is heavier. As the relay buoy 200 is not influenced by the ocean currents, observation equipment required for observation can be mounted thereon.

The relay buoy 200 includes a communicator 210, a buoy launcher 240, a propeller 230, a controller 220, and a power source 250.

The communicator 210 is configured to perform wireless transmission and reception of signals with at least observation buoy 100 and a weather information management server S. The communicator 210 communicates with the observation buoy 100 by means of Bluetooth, Wi-Fi, Wireless LAN, NFC (Near Field Communication, and short-range wireless communication technology such as infrared communication, whereas in communicating with the weather information management server S, WiMAX, Wireless LAN, CDMA, LTE-M (LTE-Maritime), 3G, 4G, 5G, or long-range wireless communication technology such as LoRa (Long Range), etc. may be used. No special limitation is applied to communication methods.

The buoy launcher 240 is configured to launch a reserve observation buoy 100 stored in an observation buoy storage 201*a* of a relay buoy main body 201 to the ocean under control by the controller 220. A point in time to launch the reserve observation buoy 100 is when a voltage of the power source 130 of the observation buoy 100 which comes close to the relay buoy 200 drops equal to or less than a preset voltage.

The propeller 230 is installed at a lower part or a side surface of the relay buoy 200 and generates propulsion, so as to move the relay buoy 200 on the ocean. When a signal level of the location information generated by the observation buoy 100 is equal to or less than a preset level, the propeller 230 generates propulsion, so as to move the relay buoy 200 close to the observation buoy (a location spaced apart from the observation buoy as much as a preset distance). The operation by the propeller 230 is controlled by the controller 220.

The controller 220 is a microprocessor which controls the whole operation of the relay buoy 200. The controller 220 senses a voltage of the power source 130 of the at least one observation buoy 100. When the sensed voltage is equal to or less than the preset voltage, the controller 240 activates the buoy launcher 240 and launches, to the ocean, the reserve observation buoy 100 stored in the observation buoy storage 201*a* of the relay buoy main body 201. The controller 220 senses the signal level of location information of the observation buoy 100 and, when the sensed signal level is equal to or less than the preset level, controls the propeller 230 to thereby move the relay buoy 200 to a location spaced part from the observation buoy 100 as much as the preset distance.

The power source 250 is configured to supply driving power to the communicator 210, the buoy launcher 240, the propeller 230, and the controller 220. A solar cell or battery may be used, and configurations thereof are not specifically limited as far as they generate driving power.

A method of tracking location using a control platform of a small buoy for simulating marine pollutants in accordance with another exemplary embodiment of the present disclosure configured as described above will be described below with reference to the accompanying drawings.

Figure 3:
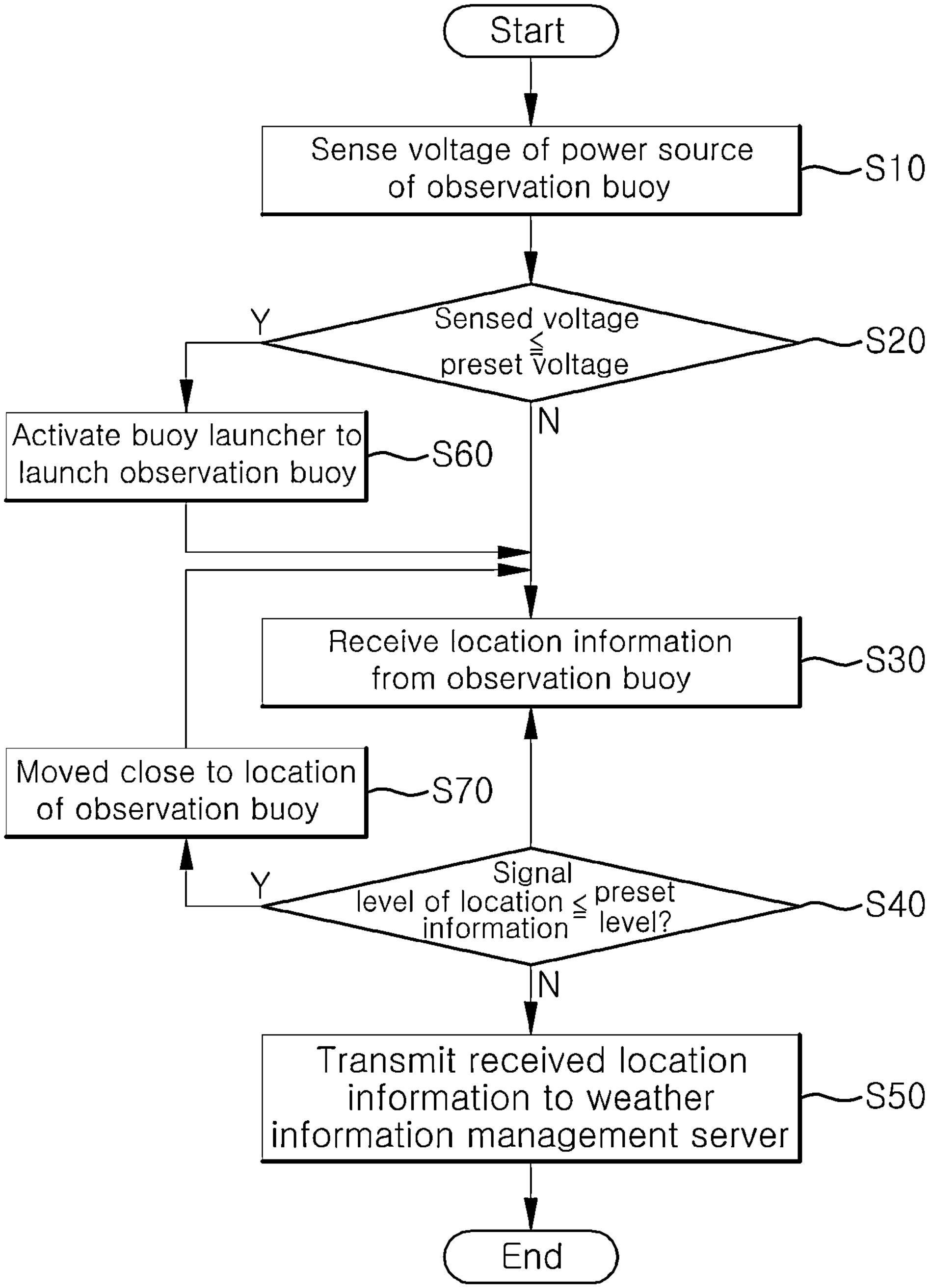
FIG. 3 is a flowchart to explain a method for tracking location using a control platform of a small buoy for simulating marine pollutants in accordance with another exemplary embodiment of the present disclosure.

FIG. 3 is a flowchart to explain a method for tracking location using a control platform of a small buoy for simulating marine pollutants in accordance with another exemplary embodiment of the present disclosure, where "S" means step.

Prior to description of the method of tracking location using a control platform of a small buoy for simulating marine pollutants, it is assumed that at least one observation buoy 100 floats on the ocean, and a relay buoy 200 floats near the observation buoy 100.

The relay buoy 200 senses a voltage of the power source 130 of the observation buoy 100 S10 and determines whether the sensed voltage is equal to or less than the preset voltage S20.

When the voltage sensed in step S20 is larger than the preset voltage N, the relay buoy 200 receives location information from the observation buoy 100 S30.

The relay buoy 200 determines whether the signal level of the location information transmitted from the observation buoy 100 is equal to or less than the preset level S40.

When the signal level of the location information sensed in step S40 is larger than the preset voltage N, the relay buoy 200 transmits the location information received from the observation buoy 100 to a weather information management server S S50.

In the meantime, when the voltage of the power source 130 of the observation buoy 100 sensed in step 20 is equal to or less than the preset level, the relay buoy 200 launches the stored reserve observation buoy to the ocean S60 and then returns to step 30.

Also, when the signal level of the location information sensed at step S40 is equal to or less than the preset level Y, the relay buoy 200 is moved due to propulsion generated by the propeller to a location spaced part from the observation buoy 100 as much as the preset distance S70, and then returns to step S30.

According to an apparatus and a method for tracking location using a control platform of a small buoy for simulating marine pollutants according to exemplary embodiments of the present disclosure, at least one observation buoy is configured to receive a signal transmitted from a GPS satellite, to generate location information, and to perform wireless transmission and reception of signals with the relay buoy, and a relay buoy is configured to receive location information from the at least observation buoy and to provide the received location information to a weather information management server, whereby location information of the observation buoy on which influence of actual ocean currents is reflected as much as possible is provided to the weather information management server, thereby being capable of enhancing accuracy of simulating the ocean currents.

Optimal embodiments are disclosed in the drawings and the specification, and specific terms are used therein. In this regard, it should be understood that they are used for the purpose of describing exemplary embodiments of the present disclosure, which are not intended to limit the meaning thereof or to limit the scope of the invention described in the claims. Accordingly, those skilled in the art will appreciate that various modifications, additions and substitutions are possible, without departing from the scope and spirit of the invention as disclosed in the accompanying claims. It is thus well known to those skilled in that art that the patent right of the present disclosure should be defined by the scope and spirit of the invention as disclosed in the accompanying claims.

What is claimed is:

1. A method for tracking location using a control platform of an observation buoy for simulating marine pollutants, wherein the method is performed using:

an observation buoy including a GPS receiver configured to receive a signal transmitted from a GPS satellite and generate location information, a communicator configured to wirelessly transmit the location information, and a power source, and a relay buoy floating on the ocean separately from the observation buoy and wirelessly communicating with the observation buoy and a weather information management server, the method comprising:

sensing, by the relay buoy, a voltage of the power source of the observation buoy;

receiving, by the relay buoy, the location information from the observation buoy generated by the GPS receiver;

determining, by the relay buoy, that a signal level of the received location information is larger than a preset level; and transmitting, by the relay buoy, the received location information to the weather information management server, wherein the observation buoy floats on the ocean and moves under influence of ocean currents, and the received location information corresponds to a location of the observation buoy reflecting the influence of the ocean currents.

2. The method of claim 1, further comprising:

determining, by the relay buoy, at a later point in time that the sensed voltage is equal to or less than the preset voltage; and launching, by the relay buoy, a reserve observation buoy stored in a relay buoy main body to the ocean.

3. The method of claim 1, further comprising:

determining, by the relay buoy, at a later point in time that the signal level of the received location information is equal to or less than the preset level; and controlling, by the relay buoy, a propeller to move to a location spaced apart from the observation buoy by a preset distance.

* * * * *